US009175413B2

(12) United States Patent
Saito et al.

(10) Patent No.: US 9,175,413 B2
(45) Date of Patent: Nov. 3, 2015

(54) COPPER ELECTROPLATING SOLUTION AND METHOD OF COPPER ELECTROPLATING

(71) Applicant: Rohm and Haas Electronic Materials LLC, Marlborough, MA (US)

(72) Inventors: Mutsuko Saito, Niigata (JP); Makoto Sakai, Niigata (JP); Toshiyuki Morinaga, Niigata (JP); Shinjiro Hayashi, Niigata (JP)

(73) Assignee: Rohm and Haas Electronic Materials LLC

( * ) Notice: Subject to any disclaimer, the term of this patent is extended or adjusted under 35 U.S.C. 154(b) by 292 days.

(21) Appl. No.: 13/727,627

(22) Filed: Dec. 27, 2012

(65) Prior Publication Data

US 2014/0183052 A1    Jul. 3, 2014

(30) Foreign Application Priority Data

Dec. 27, 2011 (JP) ................................ 2011-284647

(51) Int. Cl.
    *C25D 3/38*    (2006.01)
    *H01L 21/768*    (2006.01)
    *H01L 21/288*    (2006.01)
    *H05K 3/42*    (2006.01)

(52) U.S. Cl.
    CPC .............. *C25D 3/38* (2013.01); *H01L 21/2885* (2013.01); *H01L 21/76898* (2013.01); *H05K 3/424* (2013.01)

(58) Field of Classification Search
    CPC ........................................................ C25D 3/38
    USPC ................................................ 205/239, 296
    See application file for complete search history.

(56) References Cited

U.S. PATENT DOCUMENTS

3,716,462 A * 2/1973 Jensen .......................... 205/180
6,881,319 B2   4/2005 Seita et al.

FOREIGN PATENT DOCUMENTS

| EP | 1219729 A1 | 7/2002 | |
| EP | 1325972 A1 | 7/2003 | |
| EP | 1741804 A1 | 1/2007 | |
| JP | 02285077 A * | 11/1990 | C23C 18/38 |
| JP | 2010185113 A * | 8/2010 | C23C 18/40 |

OTHER PUBLICATIONS

European Search Report for corresponding European Application No. 12 19 9405.

* cited by examiner

*Primary Examiner* — Edna Wong

(57) ABSTRACT

A copper electroplating solution which contains compounds with the structure —X—S—Y— wherein X and Y are, independently atoms selected from a group consisting of hydrogen, carbon, sulfur, nitrogen, and oxygen, and X and Y can be the same only if they are carbon atoms and ninhydrin. By using this copper electroplating solution, it is possible to form good filled vias without worsening the appearance of the plating.

3 Claims, 7 Drawing Sheets

COPPER ELECTROPLATING SOLUTION AND METHOD OF COPPER ELECTROPLATING

FIELD OF THE INVENTION

This invention concerns a copper electroplating solution which contains specific compounds containing sulfur atoms and ninhydrin and a method of copper electroplating using this copper electroplating solution.

BACKGROUND OF THE INVENTION

In recent years, in the production of bases such as printed circuit boards which are used in electrical devices, especially personal computers, plating methods known as "through-hole plating" or "via filling plating" have been used. Copper electroplating has rapid rates of deposition of plating films in the range of 10-50 μm/hr, and therefore is expected to find application in through-hole and via plating. However, if copper is deposited on the whole inner surface of a via, the inner part of the via is filled with copper without leaving a gap; therefore, it is necessary to make the deposition rate near the bottom surface of the via faster than the rate in the opening part. If the deposition rate near the bottom is the same as or slower than the rate at the opening part, then either the via will not be filled, or the opening part will be plugged up before the copper plating filling of the inner part of the via is completed, and a gap will be left in the inner part. In either case, the product will not be suitable for use. Moreover, in through-hole plating, the throwing power into the through-hole must be good.

Up to now, in order to promote the deposition rates near the bottom surface in the via and the surface of the through-hole wall, copper electroplating baths containing specific compounds with sulfur atoms in them have been used, and the electrolysis conditions generally used direct-current electroplating, using soluble anodes such as phosphorus-containing copper anodes. However, with such a method, good via filling ability is shown immediately after the bath is made up, but over time the copper electroplating bath becomes unstable, causing lumps to form in the formation of the copper electroplating layer after a specific time has passed since the bath was made up. Various problems arise, for example, the appearance of the plating becomes worse, the filling of the vias becomes unstable, etc. Moreover, in through-hole plating, the throwing power decreases and the reliability with respect to thermal shocks decreases.

In order to solve these problems, Japanese unexamined patent application No. 2002-249891 discloses a copper electroplating solution which contains specific compounds containing sulfur atoms and thiol reactive compounds. Examples of the thiol reactive compounds are carboxylic acids, including aliphatic and alicyclic compounds, aromatic compounds, and heterocyclic compounds, peroxo acids, aldehydes and ketones, and hydrogen peroxide. It is stated in the working examples that formaldehyde improves the filling ability. In recent years, however, efforts have been made to look for other useful compounds with via filling ability improvement performances to replace formaldehyde, taking into consideration its effects on the environment and the human body, the fact that its flash point is low (66° C.), etc.

SUMMARY OF THE INVENTION

This invention was made with this situation in mind. Its purpose is to provide a copper electroplating solution which contains specific compounds containing sulfur atoms and is suitable for forming filled vias without using formaldehyde and without producing bad plating appearances, as well as a method of copper electroplating using this copper electroplating solution.

The inventors performed careful investigations of many kinds of compounds. As a result they discovered that the problems mentioned above could be solved by using ninhydrin in place of formaldehyde and perfected this invention.

That is, this invention concerns a copper electroplating solution which contains compounds with the structure —X—S—Y— where X and Y are, independently of each other, atoms selected from a group consisting of hydrogen, carbon, sulfur, nitrogen, and oxygen, and X and Y can be the same only if they are carbon atoms and ninhydrin. Moreover, this invention concerns a method of copper electroplating using this copper electroplating solution.

As will be explained below, this invention is able to reduce the effects of compounds with the structure —X—S$^-$, which are decomposition products of the aforementioned compounds containing sulfur, and by doing so avoid making the plating appearance worse or lowering the via filling ability.

DETAILED DESCRIPTION OF THE INVENTION

Figure 1:
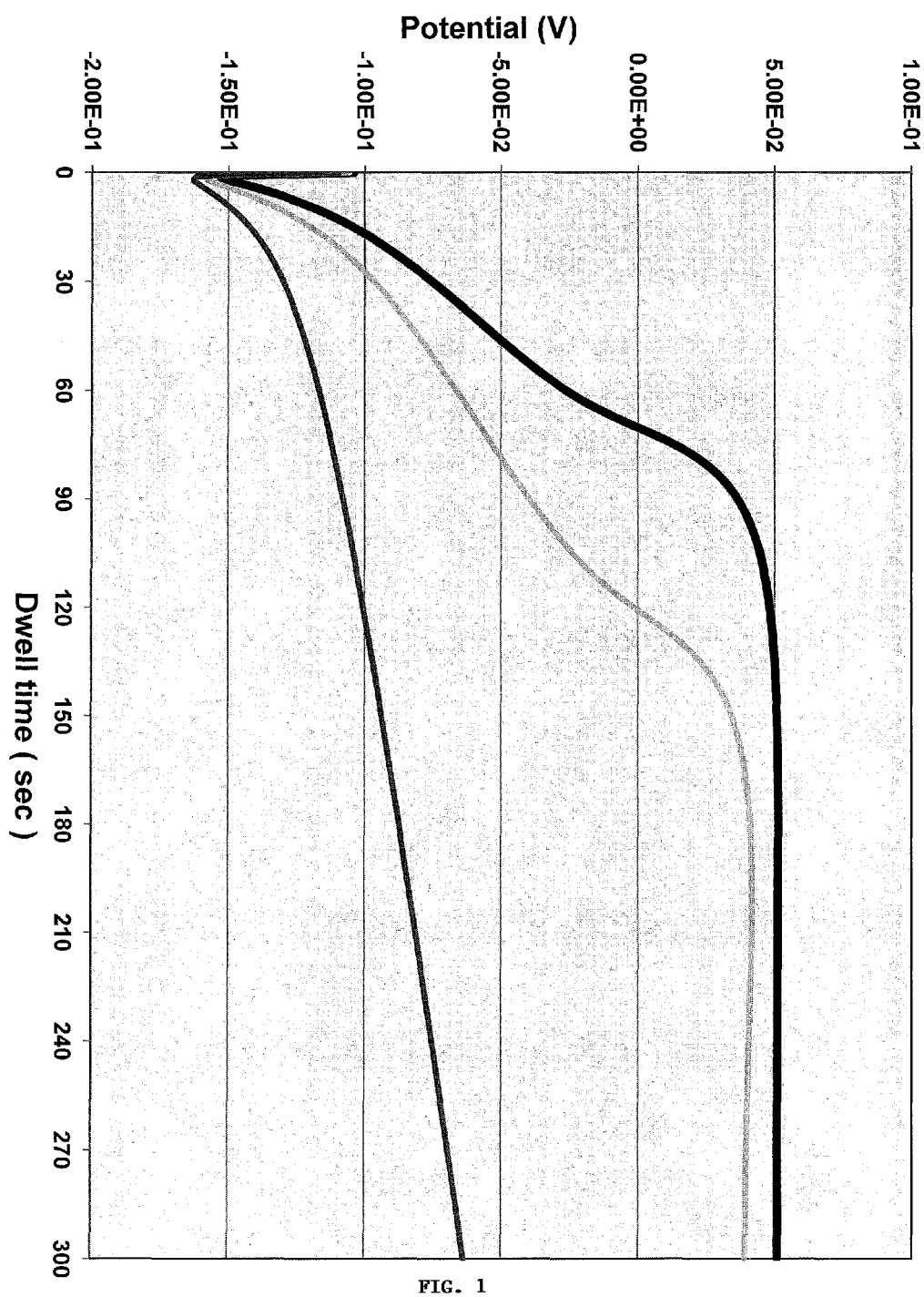
FIG. 1 is an example of the results of electrochemical measurements.

The copper electroplating solution used in this invention may be any bath solution, as long as it can electroplate copper, for example, copper sulfate, copper cyanide, copper pyrophosphate, etc.; however, it is not limited to these. Preferably, the copper electroplating solution is a copper sulfate plating solution. A copper sulfate plating solution will be used as a representative example of a copper electroplating solution in the explanation below. Furthermore, other plating solution compositions, ingredients, etc., are within ranges which persons skilled in the art can easily determine from the following statements concerning the copper sulfate plating solution in this specification, the public literature, etc.

The copper electroplating solution of this invention contains compounds with the structure X—S—Y—. Preferably, the X and Y in the structures of the aforementioned compounds are independently atoms selected from a group consisting of hydrogen, carbon, sulfur, nitrogen, and oxygen, and will be called "sulfur containing compounds" in this specification, for the sake of convenience. Still more preferably, X and Y are, independently atoms selected from a group consisting of hydrogen, carbon, and sulfur, and X and Y can be the same only if they are carbon atoms. Furthermore, in the aforementioned formula —X—S—Y—, S is shown as having a valence of 2, but this does not mean that the X and Y atoms also have valences of 2, but the formula rather shows that the X and Y atoms may bond with any other arbitrary atoms, according to these valences. For example, if X is hydrogen, the compound may have the structure H—S—Y—.

More desirably, the sulfur-containing compounds may also have sulfonic acid groups or groups which are alkali metal salts of sulfonic acid in their molecules. There may be one or more sulfonic acid groups or their alkali metal salts in these molecules. Even more desirably, examples of the sulfur-containing compounds are ones with —S—CH$_2$O—R—SO$_3$M structures in their molecules or —S—R—SO$_3$M structures in their molecules where M is a hydrogen or alkali metal atom and R is an alkyl group with 3-8 carbon atoms. Even more desirably, the sulfur-containing compounds may be compounds with the following structures (1)-(8):

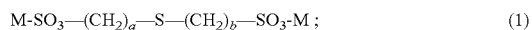
(1)

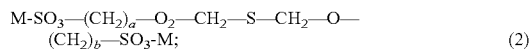
(2)

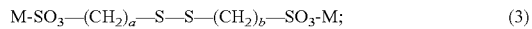
(3)

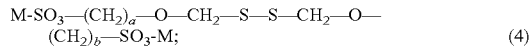
(4)

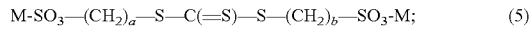
(5)

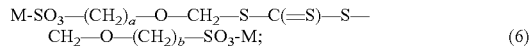
(6)

(7)

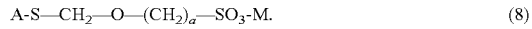
(8)

In formulas (1)-(8) above, a and b are integers from 3 to 8, M is a hydrogen or alkali meal element, and A is a hydrogen atom, $C_{1-10}$ alkyl group, aryl group, a chain or cyclic amine compound formed from 1-6 nitrogen atoms, 1-20 carbon atoms, and a plurality of hydrogen atoms, or a heterocyclic compound formed from 1-2 sulfur atoms, 1-6 nitrogen atoms, 1-20 carbon atoms, and a plurality of hydrogen atoms.

The sulfur-containing compounds are generally used as brightening agents, but they are also included in the scope of this invention if they are used for other purposes. If sulfur-containing compounds are used, one may use one compound or a mixture of 2 or more of them.

If the sulfur-containing compounds are brightening agents, the brightening agents may be used in the range, for example, of 0.1-100 mg/L or the range of 0.5-10 mg/L. If their concentration in the plating solution is less than 0.1 mg/L, the effect of aiding the growth of the copper plating film will not be obtained. Moreover, if it exceeds 100 mg/L, almost no additional effect corresponding to this additional amount will be obtained; therefore, this is not desirable economically. If the sulfur-containing compounds are used for purposes other than brightening agents, the suitable range of the quantity used is a matter which can be determined by those who are skilled in the art.

The inventors had previously discovered that —X—S—, which is a decomposition product produced by cutting a single bond of the —X—S—Y— sulfur-containing compounds mentioned above, or the addition of —Y—S$^-$ compounds, invites a worsening of the via filling ability and the plating appearance. Here, the X and Y in the aforementioned sulfur-containing compounds can be exchanged; for example, in the case of the aforementioned brightener (1) M-SO$_3$—(CH$_2$)$_a$—S—(CH$_2$)$_b$—SO$_3$-M, it is thought that M-SO$_3$—(CH$_2$)$_a$—S$^-$ or $^-$S—(CH$_2$)$_b$—SO$_3$-M is produced, but either of these may be regarded as —X—S$^-$ or —Y—S$^-$. Therefore, in this specification, the decomposition product of the sulfur-containing compound is shown as "—X—S—" for the sake of convenience.

It is not desirable to be bound by theory, but in the copper electroplating solution, as the principal mechanism by which the compounds with the structure "—X—S$^-$" are produced, one may consider, for example that if a soluble anode such as phosphorus-containing copper is used, the soluble anode and the aforementioned sulfur-containing compound react during the period in which the electrolysis is stopped, the S—X or S—Y single bond of the sulfur-containing compound is cut, and a compound with the "—X—S$^-$" structure is formed. Moreover, it may be thought that during the copper electroplating treatment the aforementioned sulfur-containing compound receives electrons at the cathode, and the single bond of the S—X or S—Y is cut, producing a compound with the structure "—X—S$^-$". Moreover, it may be thought that at the anode electrons which are released when Cu becomes Cu$^{2+}$ are received from the soluble anode and the structure of the aforementioned sulfur-containing compound becomes "—X—S$^-$".

Furthermore, it is not desirable to be bound by theory, but, as a mechanism of action by which the compounds with the "—S—X$^-$" structure produce a bad effect on the copper electroplating, it is conceivable that these compounds bond ionically with metal ions, e.g., Cu$^+$ or Cu$^{2+}$, and because compounds with these bonds exist, the deposited metal forms lumps so that metal layers which are inferior in adhesiveness, heat resistance, etc., are formed, and worsening of the plating appearance, such as inferior gloss, is caused. Moreover, it is conceivable that in the formation of filled vias, also, bonded compounds formed from the aforementioned decomposition products and metal ions lower the rate of deposition of the metal near the bottoms of the vias to about the deposition rate of the metal at the via openings or lower so that problems are caused. For example, the filling of the vias is incomplete, or gaps remain when the via is filled due to the shapes of the vias.

By performing copper electroplating using the copper electroplating solution of this invention, the concentration of compounds with the —X—S$^-$ structure can be greatly reduced, but as the concentration of compounds with the —X—S$^-$ structure, it is desirable from the point of view of not dulling the glossiness of the plating appearance to maintain this concentration at 2.0 µmol/L or lower, and from the point of view of having a glossy plating appearance, it is more desirable to keep it to 1.0 µmol/L or lower, and preferably 0.5 µmol/L. Furthermore, from the point of view of producing a good via filling ability, it is desirable to keep the concentration of compounds with the —X—S$^-$ structure to 0.15 µmol/L or lower, and preferably 0.1 µmol/L.

The copper electroplating solution of this invention contains ninhydrin. Ninhydrin also has the name "2,2-dihydroxy-indane-1,3-dione," and has the following structural formula:

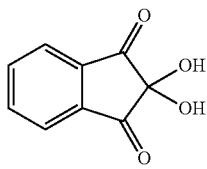 [SMILES: O=C1c2ccccc2C(=O)C1(O)O]

The ninhydrin used may be the commercial product unmodified, or it may also be produced. The quantity of ninhydrin added to the copper electroplating solution in this invention may be set at a suitable quantity according to the purposes of improving the appearance of the plating or the via filling ability, and the quantity of the sulfur-containing compounds added to the copper electroplating solution may be set at a suitable quantity according to the conditions of the copper process, for example, the kinds of electrodes used and the method of charging the current. The ninhydrin is preferably added to the copper electroplating solution in concentrations of 4-2000 mg/L ($2.5 \times 10^{-4}$-$1.1 \times 10^{-2}$ mol/L), more preferably 10-1000 mg/L ($5.6 \times 10^{-4}$-$5.6 \times 10^{-3}$ mol/L).

In this invention, the ninhydrin may be added to the copper electroplating solution at any time, for example, when the solution is made up, during the copper electroplating process, or after the process. Moreover, at the time it is added, the quantity of the compound with the "—X—S$^-$" structure in the plating solution is monitored, and it may be added if this compound exceeds the specified quantity, or it may be added by using the fact that the desired plating performance has no longer been obtained. The ninhydrin added may be the unmodified compound, or one may add it in an aqueous solution or mixed with other additives.

As the basic composition of the copper electroplating solution of this invention, one may use ones which are used in any public known, ordinary copper electroplating process, without any particular limits. As long as the purpose of this invention is accomplished, one can modify the basic composition, the concentration, the quantities of additives added, etc., so that they are suitable. For example, in the case of copper sulfate plating, the copper sulfate plating solution is an aqueous solution which contains sulfur, copper sulfate, and water-soluble chlorine compounds as the basic composition. The basic composition of this plating solution is not particularly limited, as long as it is used in publicly known copper sulfate plating.

The sulfuric acid concentration in the copper sulfate plating solution is ordinarily 10-400 g/L, and preferably 150-250 g/L, in general plating baths, such as those for through-holes, etc. Moreover, in baths for general via filling, etc., it is 10-400 g/L, preferably 50-100 g/L. The sulfuric acid concentration in the copper sulfate plating solution is ordinarily 10-400 g/L, and preferably 150-250 g/L, in general plating baths, such as those for through-holes, etc. For example, if the sulfuric acid concentration is lower than 10 g/L, the conductivity of the plating bath is lowered; therefore, it becomes difficult to make the current pass through the plating bath. Moreover, if it is over 400 g/L, the dissolution of the copper sulfate in the plating bath is impeded, and precipitation of the copper sulfate is invited. The copper sulfate concentration in the copper sulfate plating solution is ordinarily 20-280 g/L, and preferably 50-100 g/L, in general plating baths, such as those for through-holes, etc. Moreover, in baths for general via filling, etc., it is 20-280 g/L, preferably 100-250 g/L. For example, if the sulfuric acid concentration is lower than 20 g/L, the supply of the copper ions to the base, which is the object being plated, becomes insufficient and it becomes impossible to deposit a normal plating film. Moreover, it is difficult to dissolve copper sulfate at over 280 g/L.

As the water-soluble chlorine compounds contained in the copper sulfate plating solution, one can use those which are used in publicly known copper sulfate plating, without any particular limitations. As these water-soluble copper compounds, one can use, for example, hydrochloric acid, sodium chloride, potassium chloride, ammonium chloride, etc., but one is not limited to these. One may use only one kind of water-soluble chlorine compound or a mixture of 2 or more of them. The concentration of these water-soluble chlorine compounds in the copper sulfate plating solution used in this invention is ordinarily 10-200 mg/L, preferably 30-80 mg/L, as the chlorine ion concentration. For example, if the chlorine ion concentration is lower than 10 mg/L, it will be difficult to use brighteners, surfactants, etc., normally. Moreover, if it exceeds 200 mg/L, it is not desirable, since there is a great amount of chlorine gas produced from the anode.

The copper electroplating solution used in this invention may optionally contain surfactants. Ordinarily, one can use any surfactants which are ordinarily used as additives for copper electroplating solutions. Preferable examples of surfactants are those with the structures shown in (9)-(13) below, but one is not limited to these:

   (9)

(wherein a is an integer from 5 to 500);

   (10)

(wherein a is an integer from 5 to 500);

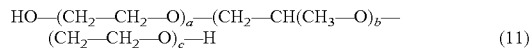   (11)

(wherein a and c are integers such that a+c=5-250 and b is an integer from 1 to 100);

   (12)

(wherein n=5-500);

and (13)

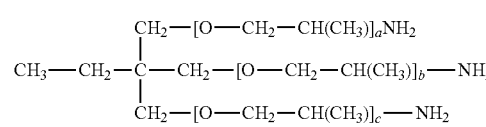

wherein a, b, and c are integers from 5 to 200.

The surfactants used in this invention may be of only one kind or a mixture of 2 or more of them. The surfactants used in this invention may be used in the range, for example, of 0.05-10 mg/L, preferably 0.1-5 g/L. If the concentration in the plating solution is less than 0.05 mg/L, the wetting efficacy will be insufficient, so that many pinholes will be produced in the plating film and it will be difficult to deposit a normal plating film. If it exceeds 10 mg/L, almost no additional effect corresponding to this additional amount will be obtained; therefore, this is not desirable economically.

The bases used in the copper electroplating method of this invention are ones which can withstand the conditions in the copper electroplating method; one may use bases of any arbitrary material and shape, as long as metal layers are formed on them by plating. The materials may be resins, ceramics, metals, etc.; there are no limits on them. For example, as bases consisting of resins, printed circuit boards may be used; as bases consisting of ceramics, semiconductor wafers may be used. However, there are no limits on these materials. As metals, silicon, etc., may be used; there are no limits on them. As bases consisting of metals, silicon wafers, etc., may be used; there are no limits on them. Since the method of copper electroplating of this invention is excellent for filling via holes, bases with through-holes, via holes, etc., are desirable as bases with which this invention may be used, and printed circuit boards or wafers with through-holes and/or via holes are more desirable.

Examples of resins which can be used in the bases are thermoplastic resins, for example, polyolefin resins, such as polyethylene resins, including high-density polyethylene, medium-density polyethylene, branched low-density polyethylene, linear low-density polyethylene, ultra-high-molecular-weight polyethylene, etc.; halogen-containing resins, such as polyvinyl chloride resins, polyvinylidene chloride resins, polyvinylidene chloride/vinyl chloride copolymer resins, chlorinated polyethylene, chlorinated polypropylene, tetrafluoroethylene, etc.; AS resins, ABS resins; MBS resins; polyvinyl alcohol resins; polyacrylate resins, such as polymethyl acrylate; polymethacrylate resins, such as polymethyl methacrylate; methyl methacrylate/styrene copolymer resins; maleic anhydride/styrene copolymer resins; polyvinyl acetate resins; cellulose resins, such as cellulose propionate resins, cellulose acetate resins, etc.; epoxy resins; polyimide resins; polyamide resins, such as nylon; polyamide imide resins; polyacrylate resins; polyether imide resins; polyether ether ketone resins; polyethylene oxide resins; various polyester resins, such as PET resins; polycarbonate resins; polysulfone resins; polyvinyl ether resins; polyvinyl butyrate resins; polyphenylene ether resins, such as polyphenylene oxide; polyphenylene sulfide resins; polybutylene terephthalate resins; polymethylpentene resins; polyacetal resins; vinyl chloride/vinyl acetate copolymers; ethylene/vinyl acetate copolymers; ethylene/vinyl chloride copolymers; etc., and copolymers and blends of these; also, thermosetting resins, for example, epoxy resins; xylene resins; guanimine resins; diallyl phthalate resins; vinyl ester resins; phenol resins; unsaturated polyester resins, furan resins; polyimide resins; polyurethane resins; maleic acid resins; melamine resins; urea resins; etc., and mixtures of these, but they are not limited to these examples. Examples of preferable resins are epoxy resins, polyimide resins, vinyl resins, phenol resins, nylon resins, polyphenylene ether resins, polypropylene resins, fluorine resins, and ABS resins; examples of still more preferably ones are epoxy resins, polyimide resins, polyphenylene ether resins, fluorine resins, and ABS resins, and examples of especially desirable ones are epoxy resins and polyimide resins. Moreover, the resin bases may consist of single resins or a plurality of resins. Furthermore, resins may be applied to other bases or laminated to make composite bases. In addition, resin bases which can be used in this invention are not limited to molded resins. They may also be composites in which reinforcing materials such as glass fiber reinforcing materials are placed between the resins, or resin films may be formed on bases consisting of various materials such as ceramics, glass, or metals such as silicon.

The ceramics which may be used as base materials include oxide ceramics, such as alumina ($Al_2O_3$), steatite ($MgO.SiO_2$), forsterite ($2MgO.SiO_2$), mullite ($3Al_2O_3.2SiO_2$), magnesia (MgO), spinel ($MgO.Al_2O_3$), and beryllia (BeO); non-oxide ceramics, such as aluminum nitride, silicon carbide, etc.; as well as low-temperature fired ceramics, such as glass ceramics. However, they are not limited to these examples.

In the bases used in the copper electroplating method of this invention, the parts to be plated are treated to make them conductive before the copper electroplating. For example, if vias will be filled with metallic copper by copper electroplating by the method of this invention, the inner surfaces of the vias are first made conductive. This treatment to make them conductive can be performed by using any publicly known methods, for example, electroless copper plating, direct plating methods, conductive microparticle adsorption processes, gas-phase plating methods, etc., but one is not limited to these examples.

In the copper electroplating method of this invention, the plating temperature (solution temperature) can be set according to the kind of plating bath, but ordinarily it is in the range of 10-40° C., preferably 20-30° C. If the plating temperature is lower than 10° C., the conductivity of the plating solution will be lowered; therefore, the current density during the electrolysis cannot be made high, the rate of growth of the plating film will be slow, and the productivity will be lowered. Moreover, if the plating temperature is higher than 40° C., the brightener may decompose; therefore, this is not desirable. In the copper electroplating method of this invention, one can use any desired kind of current, such as a PPR (pulse periodic reverse) current, etc. In the copper electroplating method of this invention, the plating temperature (solution temperature) can be set according to the kind of plating bath, but ordinarily it is in the range of 10-40° C., preferably 20-30° C. The anode current density employed is set according to the kind of plating bath used, but ordinarily it is in the range of 0.1-10 $A/dm^2$, preferably 1-3 $A/dm^2$. If it is less than 0.1 $A/dm^2$, the anode surface will be too large, which is uneconomical, and if it is greater than 10 $A/dm^2$, the quantity of oxidation decomposition of the brightener ingredient will be increased by the production of oxygen from the anode during the electrolysis; therefore, this is not desirable.

In the copper electroplating method of this invention, one can use any desired kind of electrodes, such as soluble or insoluble anodes. For example, phosphorus-containing copper anodes may be used as soluble anodes; as insoluble anodes, one may use iridium oxide, platinum-lined titanium, platinum, graphite, ferrite, titanium coated with lead dioxide and oxides of platinum group elements, stainless steel, etc. However, one is not limited to these examples. In the plating method of this invention, it is desirable to let air or oxygen pass through the plating solution, raising the dissolved oxygen concentration in the plating solution. It is not desirable to be bound by theory, but it is thought that the dissolved oxygen in the plating solution functions as an oxidant, reducing the compounds with the —X—S⁻ structure in the plating solution. As a method of raising the dissolved oxygen concentration in the plating solution, bubbling air or oxygen is desirable; this bubbling may of a type which agitates the plating solution, or it may be performed without relationship to agitation. Moreover, the bubbling to raise the dissolved oxygen concentration in the plating solution may be performed during the electroplating process or when the plating process is stopped. Moreover, in the plating method of this invention, agitation may be performed, and it is desirable to perform agitation in order to make the supply of the copper ions and additives to the surface of the object being plated uniform. In the plating method of this invention, air agitation or a jet flow may be used. Agitation by means of air is desirable from the point of view of increasing the dissolve oxygen in the plating solution. Moreover, when agitation is performed by jet flow, agitation by means of air may also be used. Furthermore, one can perform filtering alternately in two tanks or perform circulation filtering. It is especially desirable to perform circulation filtering of the plating solution with a filtering apparatus; the temperature of the plating solution can be made uniform, and dirt, precipitate, etc., can be removed from the plating solution in this way.

By means of the copper electroplating solution of this invention, a composite material with a copper layer on a base can be obtained. By performing copper electroplating using the copper electroplating solution of this invention, the copper layer of the composite material obtained will not have lumps. When vias are filled, the filling is accomplished without gaps. This invention will be explained below by means of working examples, but these examples do not limit the scope of the invention.

EXAMPLES

Analysis Methods:
1. Galvanostatic Analysis

Figure 2:
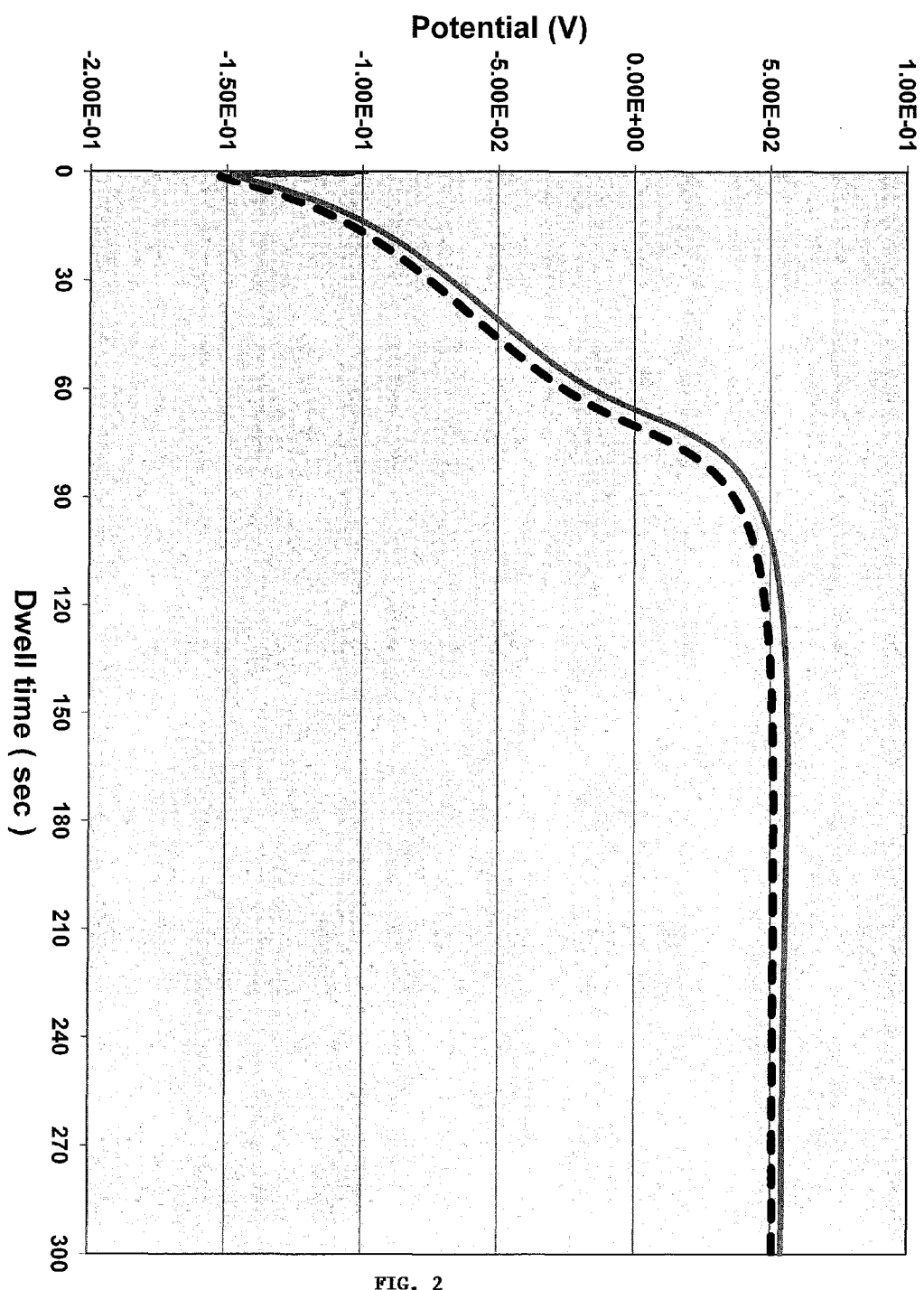
FIG. 2 is an example of the results of electrochemical measurements.

Galvanostatic analysis was performed in order to screen the performances of copper electroplating solutions containing various additives. Copper electroplating solutions with the following compositions were prepared and, in order to reproduce simulated aged plating solutions, sodium 3-mercato-1-propane sulfonate (MPS/Tokyo Kasei Co.) was added at 50 ppb. The electrode (a platinum rotating disk electrode coated with copper/PIN Co.) was immersed in the simulated aged plating solutions obtained, without applying a current, and the potential on the copper (natural potential) was measured under the conditions of 23° C., 2500 rpm, using a PGSTAT302 potentiostat/galvanostat electrochemical analysis system/Eco Chem Co. FIGS. 1 and 2 show typical examples obtained by this measurement. In FIGS. 1 and 2, the horizontal axes are the time (seconds) and the vertical axes the potential (V). The curves in FIG. 1 show the results of measuring the case in which no MPS was added (the baseline), a cases with a moderate efficacy, and a case with a high efficacy, from top to bottom. FIG. 2, on the other hand, shows a curve which is almost the same as the baseline, indicating low efficacy. The results were classified as ranks A, B, and C, from the highest to the lowest efficacy. Furthermore, rank A showed a potential of approximately less than 40% from the baseline after 90 seconds, rank B showed potentials of approximately 50-70% from the baseline, and rank C potentials of approximately 90% or more from the baseline.

Plating Solution Composition before Addition of MPS:
Copper sulfate. 5H2O:200 g/L
Sulfuric acid: 100 g/L
Chlorine: 50 g/L
Bis(3-sulfopropyl) disulfide soda (SPS): 2 mg/L
Surfactant: 2 g/L
Various additives: quantities shown in Table 1
Remainer: deionized water 2. Test Evaluating the Via Filling Ability:

The via filling abilities of the additives selected by this screening were evaluated. As the non-plated material (base), a via fill (average diameter 100 μm, depth 60 μm/CMK Co. was used; as the plating solution, a simulated deteriorated solution in which 100 ppb MPS were added to the copper electroplating solution with the composition mentioned below was used, and via-filling plating was performed by the process described below. After the plating, the vias were cut perpendicularly to the vias and the cut surfaces were observed with a metal microscope (GXt2/Olympus Co.).

Plating solution composition before addition of MPS:
Copper sulfate. 5H2O:200 g/L
Sulfuric acid: 100 g/L
Chlorine: 50 g/L
Bis(3-sulfopropyl) disulfide soda (SPS): 2 mg/L
Surfactant: 2 g/L
Various additives: quantities shown in Table 1
Remainer: deionized water Plating process:
Electroless plating (Cuposit™ 253/Rohm and Haas Electronic Materials Co.; plating conditions: 35° C., 20 minutes)
Acid washing (Acid Cleaner™ 1022-B: 10%/Rohm and Haas Electronic Materials Co.; 40° C./3 minutes)
Water washing (30-40° C., 1 minute)
Water washing (room temperature, 1 minute)
Acid washing (10% sulfuric acid, 1 minute)
Copper electroplating (various compositions, 22° C., current density: 2 A/dm, 45 minutes)
Water washing (room temperature, 1 minute)
Corrosion inhibitor (Antitarnish™ 7130 corrosion inhibitor/Rohm and Haas Electronic Materials Co.; 10° C., room temperature, 30 seconds)
Water washing (room temperature, 30 seconds)
Drying (in a dryer: 60° C., 30 seconds)

Working Examples 1-4 and Comparison Examples 1-5

Figure 3:
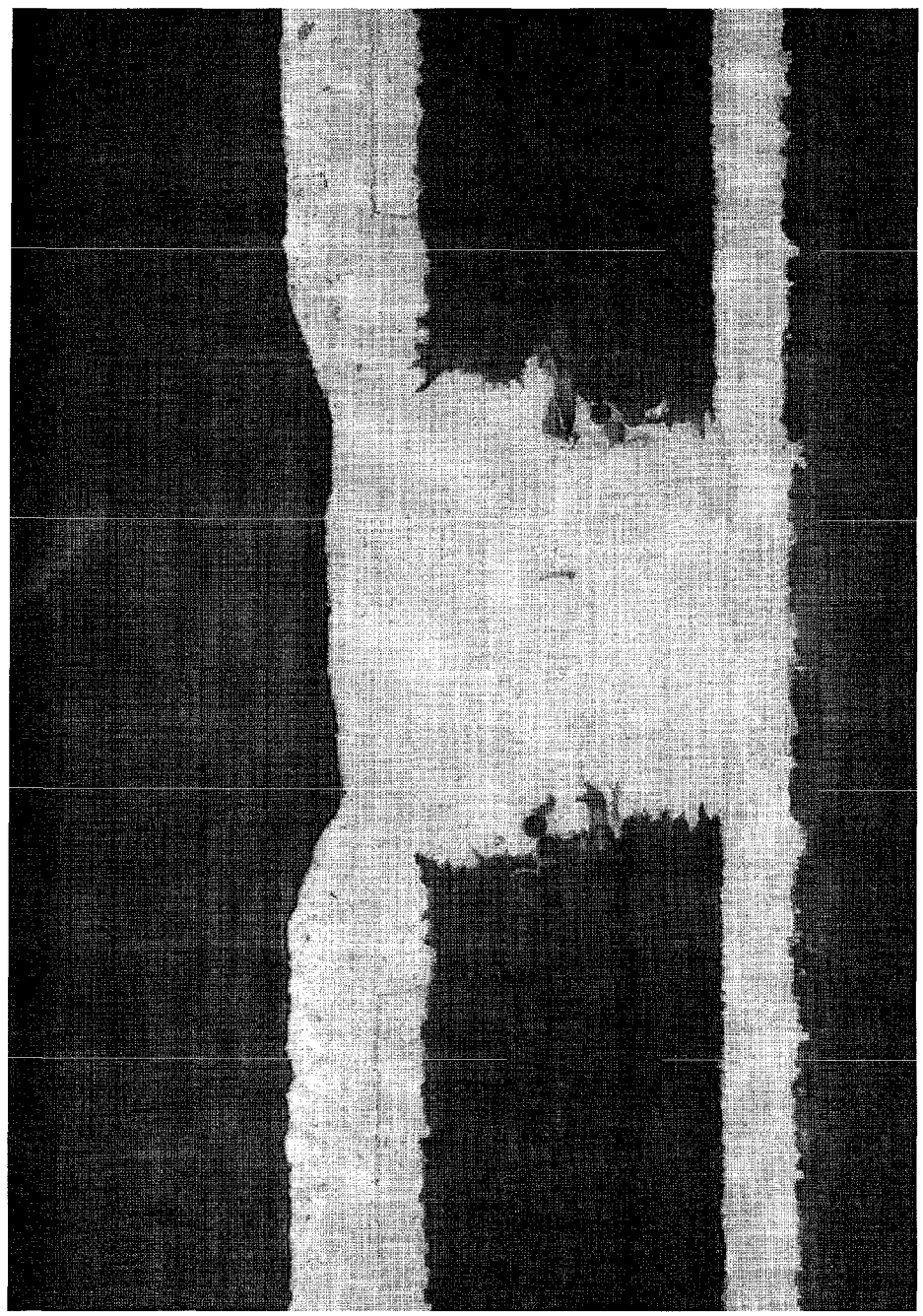
FIG. 3 shows the filling ability of a via when the plating solution of Working Example 1 is used and it shows the state of a cross section of a via after the plating treatment.
Figure 4:
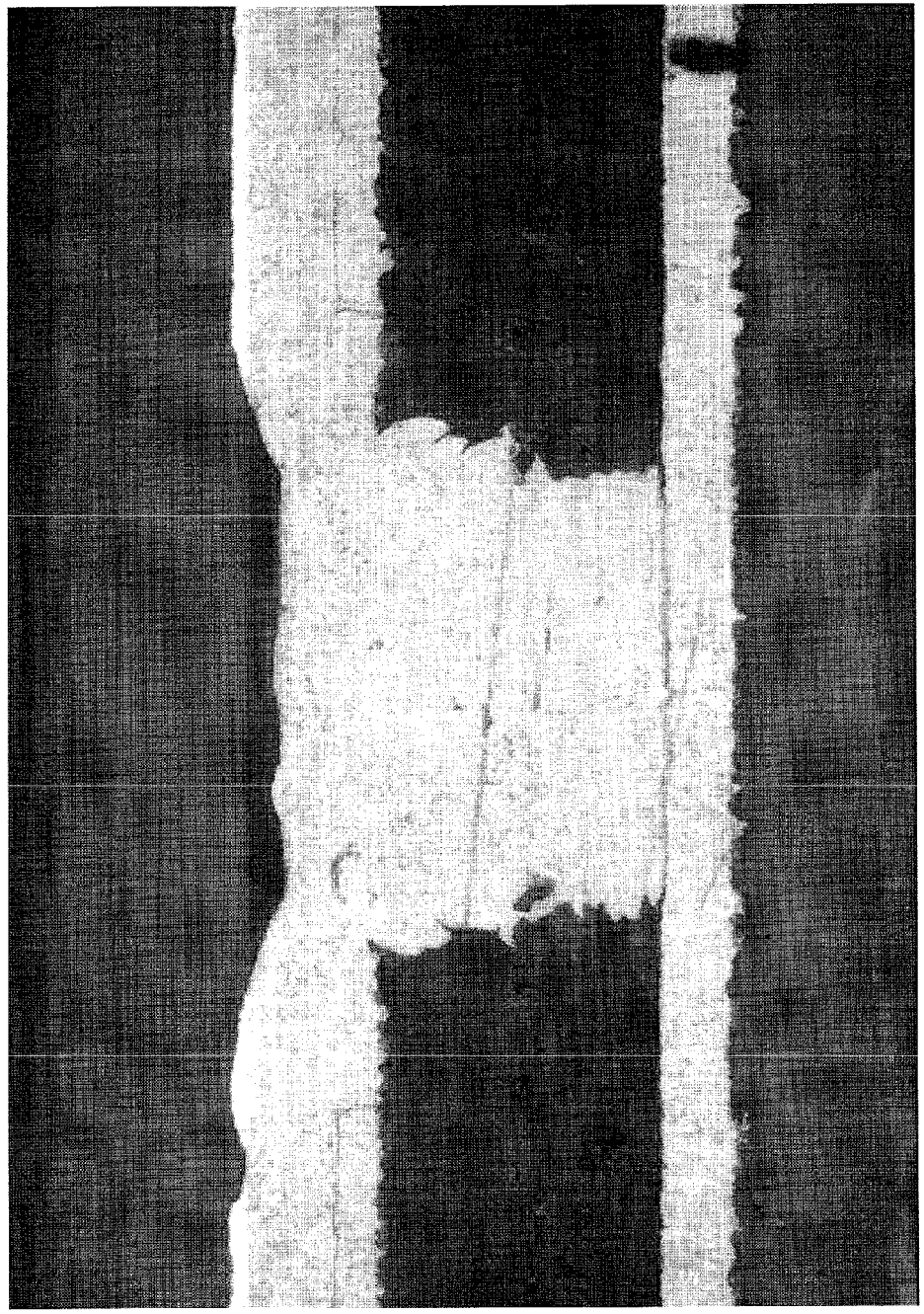
FIG. 4 shows the filling ability of a via when the plating solution of Working Example 3 is used and it shows the state of a cross section of a via after the plating treatment.
Figure 5:
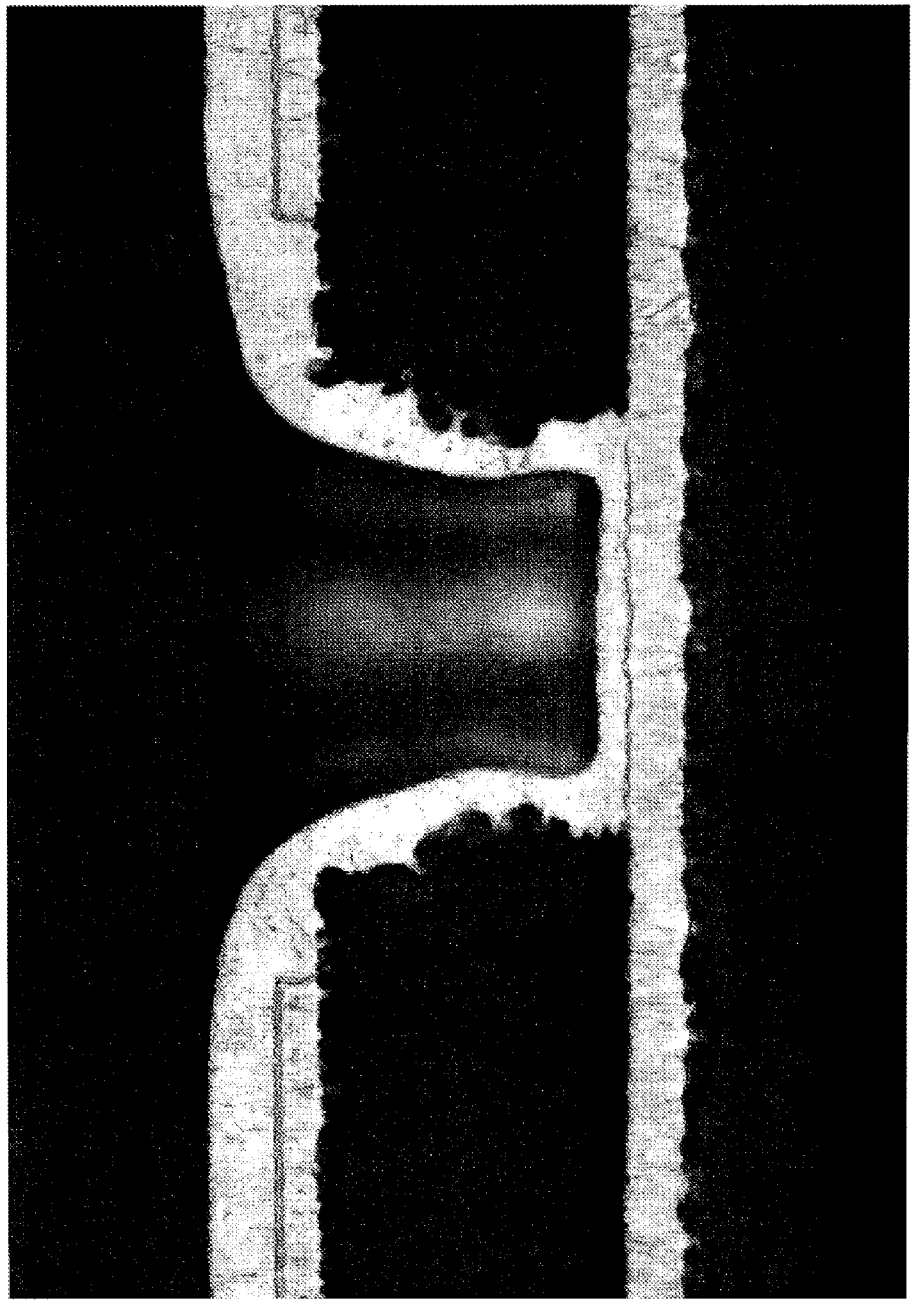
FIG. 5 shows the filling ability of a via when the plating solution of Comparison Example 1 is used and it shows the state of a cross section of a via after the plating treatment.
Figure 6:
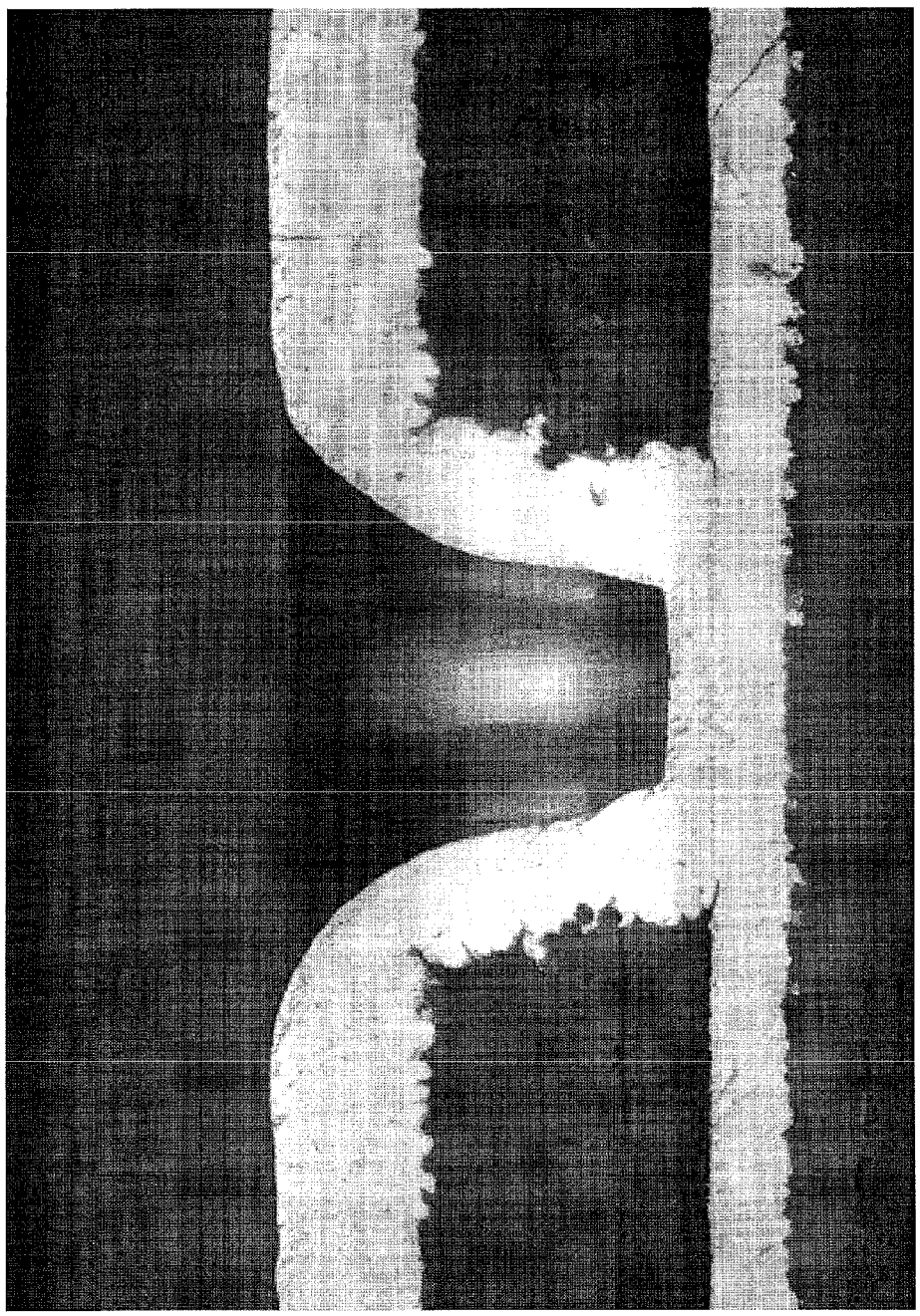
FIG. 6 shows the filling ability of a via when the plating solution of Comparison Example 3 is used and it shows the state of a cross section of a via after the plating treatment.
Figure 7:
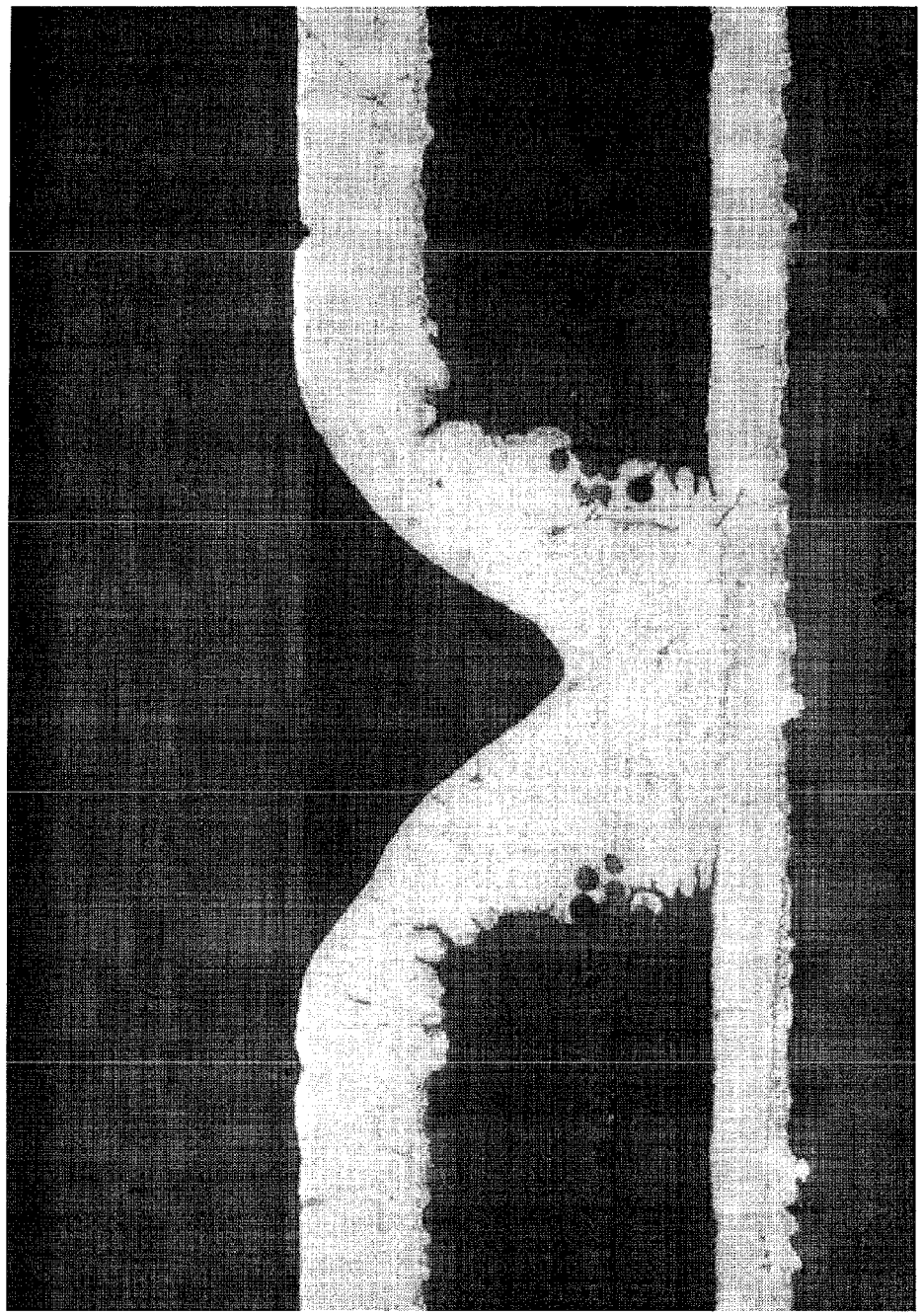
FIG. 7 shows the filling ability of a via when the plating solution of Comparison Example 5 is used and it shows the state of a cross section of a via after the plating treatment.

The tests were performed using the additives shown in Table 1 in the quantities shown in Table 1. The results are shown in Table 1. Moreover, FIG. 3 shows a microphotograph obtained when the via filling test was performed in Working Example 1. FIG. 4 shows a microphotograph obtained when the via filling test was performed in Working Example 3. FIG. 5 shows a microphotograph obtained when the via filling test was performed in Comparison Example 1. FIG. 6 shows a microphotograph obtained when the via filling test was performed in Comparison Example 3; and FIG. 7 shows a microphotograph obtained when the via filling test was performed in Comparison Example 5.

TABLE 1

| Working/Comparison Examples | Kind of additive | Galvanostatic measurements | | Via filling test | | Overall evaluation |
|---|---|---|---|---|---|---|
| | | Quantity of additive added (ppm) | Evaluation | Quantity of additive added (ppm) | Evaluation | |
| Working Example 1 | Ninhydrin | 5 | B | 5 | Good | Good |
| Working Example 2 | Ninhydrin | 500 | A | 500 | Good | Good |
| Working Example 3 | Ninhydrin | 1000 | A | 1000 | Good | Good |

TABLE 1-continued

| Working/ Comparison Examples | Kind of additive | Galvanostatic measurements | | Via filling test | | Overall evaluation |
| --- | --- | --- | --- | --- | --- | --- |
| | | Quantity of additive added (ppm) | Evaluation | Quantity of additive added (ppm) | Evaluation | |
| Comparison Example 1 | None (blank) | — | C | — | Bad | Bad |
| Comparison Example 2 | Indane | 1000 | C | 500 | Bad | Bad |
| Comparison Example 3 | 1,2-Dihydroxy-indane | 1000 | C | 500 | Bad | Bad |
| Comparison Example 4 | Indan-1-one | 1000 | C | 500 | Bad | Bad |
| Comparison Example 5 | 1,3-Indanedione | 1000 | C | 500 | Bad | Bad |

As is clear from these working and comparison examples, high via filling abilities were observed in the working examples in which ninhydrin was used, but no improvement in via filling ability was seen in the example in which the additive was not used (Comparison Example 1) and the examples in which compounds similar to ninhydrin were used (Comparison Examples 2-5).

What is claimed is:

1. A method of copper electroplating comprising:
a) providing a base comprising vias, through-holes or vias and through-holes;
b) immersing the base comprising the vias, through-holes or vias and through-holes in a copper electroplating solution comprising water soluble copper compounds selected from the group consisting of copper sulfate and copper pyrophosphate; ninhydrin; and compounds selected from the group consisting of:

$$M\text{-}SO_3\text{—}(CH_2)_a\text{—}S\text{—}(CH_2)_b\text{—}SO_3\text{-}M; \quad (1)$$

$$M\text{-}SO_3\text{—}(CH_2)_a\text{—}O_2\text{—}CH_2\text{—}S\text{—}CH_2\text{—}O\text{—}(CH_2)_b\text{—}SO_3\text{-}M; \quad (2)$$

$$M\text{-}SO_3\text{—}(CH_2)_a\text{—}S\text{—}S\text{—}(CH_2)_b\text{—}SO_3\text{-}M; \quad (3)$$

$$M\text{-}SO_3\text{—}(CH_2)_a\text{—}O\text{—}CH_2\text{—}S\text{—}S\text{—}CH_2\text{—}O\text{—}(CH_2)_b\text{—}SO_3\text{-}M; \quad (4)$$

$$M\text{-}SO_3\text{—}(CH_2)_a\text{—}S\text{—}C(=S)\text{—}S\text{—}(CH_2)_b\text{—}SO_3\text{-}M; \quad (5)$$

$$M\text{-}SO_3\text{—}(CH_2)_a\text{—}O\text{—}CH_2\text{—}S\text{—}C(=S)\text{—}S\text{—}CH_2\text{—}O\text{—}(CH_2)_b\text{—}SO_3\text{-}M; \quad (6)$$

wherein a and b in compounds (1)-(6) are integers from 3 to 8, M is hydrogen or an alkali metal element; and
c) electroplating copper on the base and in the vias, or through-holes or in the vias and through-holes.

2. The method of claim 1, wherein a current density during electroplating copper is 0.1-10 A/dm$^2$.

3. The method of claim 1, wherein the water soluble copper compound is copper sulfate.

* * * * *